US012796308B2

(12) United States Patent
Hou et al.

(10) Patent No.: US 12,796,308 B2
(45) Date of Patent: Nov. 10, 2026

(54) DISPLAY DEVICE AND PREPARATION METHOD THEREFOR

(71) Applicant: TCL TECHNOLOGY GROUP CORPORATION, Huizhou (CN)

(72) Inventors: Wenjun Hou, Huizhou (CN); Yixing Yang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 803 days.

(21) Appl. No.: 18/260,178

(22) PCT Filed: Dec. 29, 2021

(86) PCT No.: PCT/CN2021/142475

§ 371 (c)(1),
(2) Date: Jun. 30, 2023

(87) PCT Pub. No.: WO2022/143770

PCT Pub. Date: Jul. 7, 2022

(65) Prior Publication Data

US 2024/0016018 A1 Jan. 11, 2024

(30) Foreign Application Priority Data

Dec. 31, 2020 (CN) ......................... 202011645327.6

(51) Int. Cl.
*H10K 85/10* (2023.01)
*H10K 50/115* (2023.01)
(Continued)

(52) U.S. Cl.
CPC ......... *H10K 85/115* (2023.02); *H10K 50/115* (2023.02); *H10K 50/166* (2023.02);
(Continued)

(58) Field of Classification Search
None
See application file for complete search history.

(56) References Cited

U.S. PATENT DOCUMENTS

2016/0260921 A1 9/2016 Liu et al.
2016/0351843 A1 12/2016 Yang et al.

FOREIGN PATENT DOCUMENTS

CN 103943059 A 7/2014
CN 106298853 A 1/2017
(Continued)

OTHER PUBLICATIONS

The World Intellectual Property Organization (WIPO) International Search Report for PCT/CN2021/142475 Mar. 30, 2022 5 Pages (including translation).

*Primary Examiner* — Samir Shah
(74) *Attorney, Agent, or Firm* — ANOVA LAW GROUP, PLLC

(57) ABSTRACT

Disclosed are display device and preparation method therefor. Display device includes red light sub pixel, green light sub pixel, and first blue light sub pixel. Red light sub pixel includes anode, hole functional layer, red quantum dot light-emitting layer, transition layer, electron transport layer, and cathode arranged sequentially in layers. Green light sub pixel includes anode, hole functional layer, green quantum dot light-emitting layer, transition layer, electron transport layer, and cathode arranged sequentially in layers. First blue light sub pixel includes anode, hole functional layer, blue light organic light-emitting material layer, transition layer, electron transport layer, and cathode arranged sequentially in layers. Material of transition layer includes aromatic compound with conjugate plane, material of electron transport layer includes metal oxide. Ensuring same structure and technology of R, G, and B1 sub pixels, effectively solving problem of incompatibility between structure and technology during process of preparing existing QLED and OLED.

18 Claims, 4 Drawing Sheets

(51) Int. Cl.

| | |
|---|---|
| ***H10K 50/16*** | (2023.01) |
| ***H10K 59/35*** | (2023.01) |
| ***H10K 59/80*** | (2023.01) |
| ***H10K 71/00*** | (2023.01) |
| ***H10K 71/60*** | (2023.01) |
| ***H10K 85/00*** | (2023.01) |
| ***H10K 85/30*** | (2023.01) |
| *H10K 50/18* | (2023.01) |
| *H10K 102/00* | (2023.01) |

(52) U.S. Cl.

CPC ..... *H10K 59/353* (2023.02); *H10K 59/80523* (2023.02); *H10K 59/875* (2023.02); *H10K 71/60* (2023.02); *H10K 71/851* (2023.02); *H10K 85/00* (2023.02); *H10K 85/324* (2023.02); *H10K 50/181* (2023.02); *H10K 2102/351* (2023.02)

(56) References Cited

FOREIGN PATENT DOCUMENTS

| | | | | |
|---|---|---|---|---|
| CN | 106299156 | A | 1/2017 | |
| CN | 106601923 | A | 4/2017 | |
| CN | 106654026 | A | 5/2017 | |
| CN | 111490070 | A | 8/2020 | |
| CN | 111883675 | A | 11/2020 | |
| WO | WO-2017210927 | A1 * | 12/2017 | ............. H10D 86/00 |
| WO | 2020041993 | A1 | 3/2020 | |

* cited by examiner

DISPLAY DEVICE AND PREPARATION METHOD THEREFOR

CROSS-REFERENCES TO RELATED APPLICATIONS

This application is a national stage application of PCT Patent Application No. PCT/CN2021/142475, filed on Dec. 29, 2021, which claims priority to Chinese patent application No. 202011645327.6, titled "Display device and preparation method therefore", and filed on Dec. 31, 2020, the content of all of which is incorporated herein by reference.

FIELD OF THE DISCLOSURE

The present disclosure relates to the technical field of display devices, in particular to a display device and a preparation method therefor.

BACKGROUND

Due to the unique optoelectronic properties of quantum dot, such as continuously adjustable emission wavelength following size and composition, narrow luminescence spectrum, high fluorescence efficiency, and good stability, light-emitting diodes based on quantum dot (QLED) have received widespread attention and research in display field. In addition, QLED display has many advantages that liquid crystal display (LCD) cannot achieve, such as large view angle, high contrast, fast speed of response, and flexibility, making the QLED display expected to become the next generation of display technology.

QLED device requires an injection of electrons and injection of holes during operation. The simplest QLED device consists of a cathode, an electron transport layer, a quantum dot light-emitting layer, a hole transport layer, and an anode. In the QLED device, the quantum dot light-emitting layer is sandwiched between the charge transport layers. When a forward bias is applied to two ends of the QLED device, the electrons and the holes enter the quantum dot light-emitting layer through the electron transport layer and the hole transport layer, respectively, and undergo combination luminescence in the quantum dot light-emitting layer.

After more than 20 years of development, quantum dot material has made significant progress, and an external quantum efficiency of a red QLED device, a green QLED device and a blue QLED device has been greatly improved, especially in a device mainly composed of CdSe. The improvement of the QLED device's efficiency highlights its future prospects. So far, a quantum efficiency of a red quantum dot device and a green quantum dot device is greater than 20%, and a device lifetime thereof is at the same level as that of the red organic light-emitting diodes (OLED) device and the green OLED device, reaching a level of commercial application. However, compared to the blue OLED device, a blue quantum dot device has large gap in both device efficiency and device lifetime.

Therefore, the prior art still needs to be improved and developed.

BRIEF SUMMARY OF THE DISCLOSURE

Given the above findings, the present disclosure provides a composite device structure that combines quantum dot light-emitting diodes (QLED) and organic light-emitting diodes (OLED), wherein a red light sub pixel and a green light sub pixel both adopt the QLED structure, while a blue light sub pixel adopts the OLED structure, ensuring that the red light sub pixel, the green light sub pixel, and the blue light sub pixel can achieve high luminous efficiency and long lifetime.

Furthermore, it is found that the composite device structure based on the QLED and OLED may face a problem of incompatibility between structure and technology during a process of preparing a full-color display device. This is because in the QLED device, only an electron transport layer prepared by inorganic metal oxide nanoparticles, such as ZnO etc. as the electron transport layer, has excellent performance of electron transport. A technology of preparing the electron transport layer using the inorganic metal oxide nanoparticles is generally a solution method, such as an inkjet printing method, a spin coating method, etc. In the OLED device, a material of the electron transport layer is generally an organic small-molecule material, and a technology of preparing the electron transport layer using the organic small-molecule material is generally an evaporation method. Therefore, it is not compatible in the technology of preparing the electronic transport layer, and it cannot meet needs of both the QLED and the OLED simultaneously.

Based on these above, the present disclosure provides a display device, the display device includes a plurality of pixels arranged in an array, each pixel includes a red light sub pixel, a green light sub pixel, and a first blue light sub pixel arranged in an array;

The red light sub pixel includes a first anode, a first hole functional layer, a red light quantum dot emitting layer, a first transition layer, a first electron transport layer, and a first cathode arranged sequentially in layers;

The green light sub pixel includes a second anode, a second hole functional layer, a green light quantum dot emitting layer, a second transition layer, a second electron transport layer, and a second cathode arranged sequentially in layers;

The first blue light sub pixel includes a third anode, a third hole functional layer, a blue light organic emitting material layer, a third transition layer, a third electron transport layer, and a third cathode arranged sequentially in layers;

The first anode of the red light sub pixel, the second anode of the green light sub pixel, and the third anode of the first blue light sub pixel are located on one same side of the display device;

A material of the first transition layer, a material of the second transition layer, and a material of the third transition layer all include an aromatic compound with a conjugate plane, and a material of the first electron transport layer, a material of the second electron transport layer, and a material of the third electron transport layer all include a metal oxide.

In some embodiments, the each pixel further includes a second blue light sub pixel, the second blue light sub pixel includes a fourth anode, a fourth hole functional layer, a blue light quantum dot emitting layer, a fourth transition layer, a fourth electron transport layer, and a fourth cathode arranged sequentially in layers;

The fourth anode in the second blue light sub pixel and the third anode in the first blue light sub pixel are located on one same side;

A material of the fourth transition layer includes an aromatic compound with a conjugate plane; a material of the fourth electron transport layer includes a metal oxide.

In some embodiments, the aromatic compound with the conjugate plane is selected from one or more of 8-hydroxyquinoline aluminum, 1,2,4-triazole derivative, phenyl biphenylyl oxadiazole (PBD), 8-hydroxyquinoline beryllium (Beq2) and 4,4'-bis(2,2-diphenylvinyl)-1,1'-biphenyl (DPVBi).

In some embodiments, a thickness of the first transition layer is 2-20 nm;

And/or a thickness of the second transition layer is 2-20 nm;

And/or a thickness of the third transition layer is 2-20 nm;

And/or a thickness of the fourth transition layer is 20-20 nm.

In some embodiments, a thickness of the first electron transport layer is 20-50 nm;

And/or a thickness of the second electron transport layer is 20-50 nm;

And/or a thickness of the third electron transport layer is 20-50 nm;

And/or a thickness of the fourth electron transport layer is 20-50 nm.

In some embodiments, an emission wavelength of the red light quantum dot is 610-625 nm, and/or an emission wavelength of the green light quantum dot is 525-550 nm, and/or the blue light organic emitting material is selected from one or more of a polyfluorene and a derivative of the polyfluorene.

In some embodiments, the red light sub pixel further includes a first capping layer, the first capping layer is located on a surface of one side of the first cathode away from the first anode;

The green light sub pixel further includes a second capping layer, the second capping layer is located on a surface of one side of the second cathode away from the second anode;

The first blue light sub pixel further includes a third capping layer, the third capping layer is located on a surface of one side of the third cathode away from the third anode.

A preparation method for a display device comprising a plurality of pixels arranged in an array, wherein each pixel includes a red light sub pixel, a green light sub pixel, and a first blue light sub pixel arranged in an array;

A preparation method for the each pixel includes steps:

Dividing a substrate into a red light sub pixel region, a green light sub pixel region, and a first blue light sub pixel region;

Forming a first anode, a second anode, and a third anode within the red light sub pixel region, the green light sub pixel region, and the first blue light sub pixel region, respectively; and forming a first hole functional layer, a second hole functional layer, and a third hole functional layer on the first anode, the second anode, and the third anode, respectively;

Forming a red light quantum dot emitting layer, a green light quantum dot emitting layer, and a blue light organic emitting material layer on the first hole functional layer, the second hole functional layer, and the third hole functional layer, respectively;

Forming a first transition layer, a second transition layer, and a third transition layer on the red light quantum dot emitting layer, the green light quantum dot emitting layer, and the blue light organic emitting material layer, respectively; and forming a first electron transport layer, a second electron transport layer, and a third electron transport layer on the first transition layer, the second transition layer, and the third transition layer, respectively;

Forming a first cathode, a second cathode, and a third cathode on the first electron transport layer, the second electron transport layer, and the third electron transport layer, respectively, to obtain the red light sub pixel, the green light sub pixel, and the first blue light sub pixel, respectively;

Wherein a material of the first transition layer, a material of the second transition layer, and a material of the third transition layer all include an aromatic compound with a conjugate plane; a material of the first electron transport layer, a material of the second electron transport layer, and a material of the third electron transport layer all include a metal oxide.

In some embodiments, the aromatic compound with the conjugate plane is selected from one or more of 8-hydroxyquinoline aluminum, 1,2,4-triazole derivative, phenyl biphenylyl oxadiazole (PBD), 8-hydroxyquinoline beryllium (Beq2) and 4,4'-bis(2,2-diphenylvinyl)-1,1'-biphenyl (DPVBi).

A preparation method for a display device comprising a plurality of pixels arranged in an array, wherein each pixel includes a red light sub pixel, a green light sub pixel, and a first blue light sub pixel arranged in an array;

A preparation method for the each pixel includes steps:

Dividing a substrate into a red light sub pixel region, a green light sub pixel region, and a first blue light sub pixel region;

Forming a first cathode, a second cathode, and a third cathode within the red light sub pixel region, the green light sub pixel region, and the first blue light sub pixel region, respectively; forming a first electron transport layer, a second electron transport layer, and a third electron transport layer on the first anode, the second anode, and the third anode, respectively;

Forming a first transition layer, a second transition layer, and a third transition layer on the first electron transport layer, the second electron transport layer, and the third electron transport layer;

Forming a red light quantum dot emitting layer, a green light quantum dot emitting layer, and a blue light organic emitting material layer on the first transition layer, the second transition layer, and the third transition layer, respectively;

Forming a first hole functional layer, a second hole functional layer, and a third hole functional layer on the red light quantum dot emitting layer, the green light quantum dot emitting layer, and the blue light organic emitting material layer, respectively;

Forming a first anode, a second anode, and a third anode on the first hole functional layer, the second hole functional layer, and the third hole functional layer, respectively, to obtain the red light sub pixel, the green light sub pixel, the first blue light sub pixel, respectively;

Wherein a material of the first transition layer, a material of the second transition layer, and a material of the third transition layer all include an aromatic compound with a conjugate plane; a material of the first electron transport layer, a material of the second electron transport layer, and a material of the third electron transport layer all include a metal oxide.

Beneficial effects: The present disclosure provides a full-color display device that combines QLED and OLED. In a R sub pixel and a G sub pixel of the present disclosure, a transition layer with a certain electron transport ability is added between a quantum dot light-emitting layer and a metal oxide electron transport layer. As the electron transport ability of the transition layer is more than one order of magnitude lower than that of the metal oxide electron transport material, the transition layer can play a role in suppressing electron transport, thereby facilitating regulating a balance of injection and transportation of charge carriers in the R sub pixel and the G sub pixel, improving performance of the R sub pixel and the G sub pixel. At the same time, the transition layer can isolate the metal oxide electron transport layer from the quantum dot light-emitting layer, thereby effectively suppressing a defect state luminescence of the metal oxide. In a B1 sub pixel of the present disclosure, a transition layer with a certain electron transport ability is added between an organic material light-emitting layer and a metal oxide electron transport layer, the transition layer can play a role in electron transport. Moreover, since the electron transport layer in the B1 sub pixel adopts the metal oxide, an electron transport ability of the electron transport layer is much higher than that of the transition layer, thereby ensuring the electron transport. Therefore, by adding the transition layer in the R sub pixel and the G sub pixel based on quantum dot and in the B1 sub pixel based on the organic light-emitting material, and using the metal oxide as the electron transport layer in the B1 sub pixel, structure and technology of the R sub pixel, the G sub pixel and the B1 sub pixel are ultimately ensured to be the same, effectively solving the problem of incompatibility between structure and technology during existing process of preparing QLED and OLED.

DETAILED DESCRIPTION OF EMBODIMENTS

The present disclosure provides a display device and a preparation method therefor. In order to make the purpose, technical solution and effect of the present disclosure clearer and more definite, the present disclosure is further described in detail below. It should be understood that the embodiments described here are only used to explain the present disclosure, not to limit the present disclosure.

Firstly, it should be noted that in the embodiments, each sub pixel has multiple forms, and each sub pixel is divided into a forward and a reverse structure. When an anode is located on a substrate 200, the sub pixel is the forward structure; when a cathode is located on the substrate 200, the sub pixel is the reverse structure. The present embodiments here mainly introduce the structure shown in FIG. 1 as an example in detail.

Figure 1:
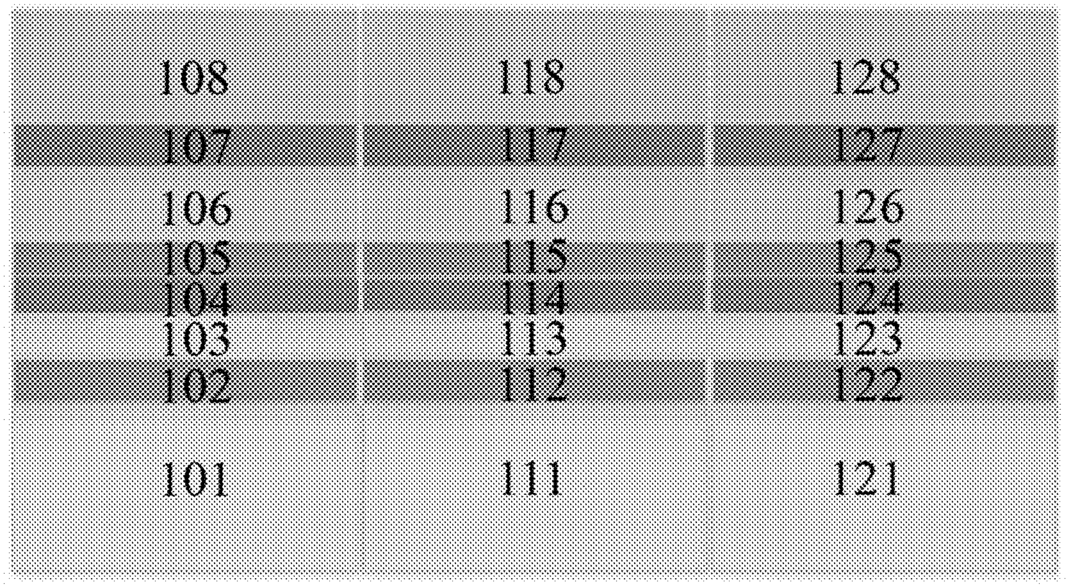
FIG. 1 is a schematic diagram of a structure of a display device provided in one embodiment of the present disclosure.

As shown in FIG. 1, one embodiment of the present disclosure provides a display device, the display device includes a plurality of pixels arranged in an array, wherein each pixel includes a red light sub pixel, a green light sub pixel, and a first blue light sub pixel arranged in an array.

The red light sub pixel includes a first anode 101, a first hole injection layer (HIL) 102, a first hole transport layer (HTL) 103, a red light quantum dot emitting layer (EML-R, QD) 104, a first transition layer (BL) 105, a first electron transport layer (ETL) 106, a first cathode 107, and a first capping layer (CPL, such as n-propyl Bromide, i.e. NPB) 108 arranged in layers in sequence.

The green light sub pixel includes a second anode (such as indium tin oxide/Ag/indium tin oxide, i.e. ITO/Ag/ITO) 111, a second hole injection layer (HIL) 112, a second hole transport layer (HTL) 113, a green light quantum dot emitting layer (EML-G, QD) 114, a second transition layer (BL) 115, a second electron transport layer (ETL) 116, a second cathode 117, and a second capping layer (CPL, such as NPB) 118 arranged in layers in sequence.

The first blue light sub pixel includes a third anode (such as ITO/Ag/ITO) 121, a third hole injection layer (HIL) 122, a third hole transport layer (HTL) 123, a blue light organic emitting material layer (EML-B, OLED) 124, a third transition layer (BL) 125, a third electron transport layer (ETL) 126, a third cathode 127, and a third capping layer (CPL, such as NPB) 128 arranged in layers in sequence.

Among them, the first anode, the second anode, and the third anode of the red light sub pixel, the green light sub pixel, and the first blue light sub pixel are located on one same side of the display device.

Among them, materials of the first transition layer, the second transition layer, and the third transition layer all include an aromatic compound with a conjugate plane, and materials of the first electron transport layer, the second electron transport layer, and the third electron transport layer all include a metal oxide.

In the present embodiment, the display device includes a plurality of pixels, each pixel includes three sub pixels. The three sub pixels are: red light sub pixel (R sub pixel), green light sub pixel (G sub pixel), and first blue light sub pixel (B1 sub pixel). In the present embodiment, each pixel includes the R sub pixel, the G sub pixel, and the B1 sub pixel, and through the three-primary colors of R, G, and B1 light, a full-color display of the display device is achieved. Among them, the R sub pixel, the G sub pixel, and the B1 sub pixel are arranged in an array, each of which is independently driven to light up and is independently driven to light up by a driving circuit.

In the present embodiment, both the R sub pixel and the G sub pixel are light-emitting diodes based on quantum dot luminous materials (QLEDs), while the B1 sub pixel is light-emitting diodes based on organic luminous materials (OLED), so that the R sub pixel and the G sub pixel can achieve high luminous efficiency and long lifetime, while the B1 sub pixel can also achieve high luminous efficiency and long lifetime. By combining red light and green light QLED and blue light OLED, the luminous efficiency and lifetime of the full-color display device are improved as a whole.

In the present embodiment, materials of the first transition layer, the second transition layer, and the third transition layer are all an aromatic compound with a conjugated plane. The material has a certain electron transport ability, which is more than one order of magnitude lower than the electron transport ability of a metal oxide electron transport material commonly used in quantum dot light-emitting diodes. In one embodiment, the aromatic compound with the conjugate plane may be selected from one or more of 8-hydroxyquinoline aluminum (AlQ), 1,2,4-triazole derivatives, PBD, TPBI, BPQ, NCB, Beq2 and DPVBi.

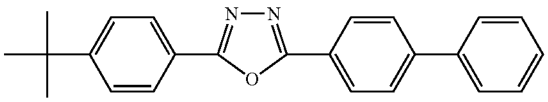

PBD

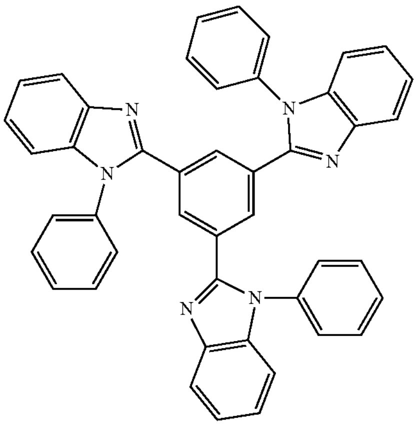

TPBI

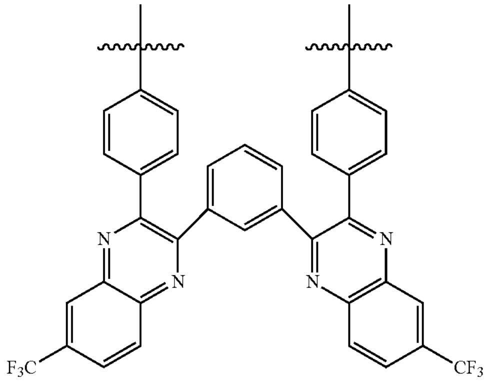

BPQ

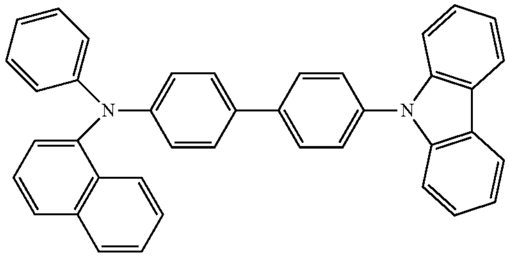

NCB

In existing R sub pixel and G sub pixel based on quantum dot materials, injection and transportation efficiency of electrons is usually much higher than that of holes, resulting in an imbalance between the injection of electrons and the injection of the holes, and limiting an improvement of device efficiency. In the R sub pixel and the G sub pixel of the present embodiment, a transition layer with a certain electron transport ability is added between the quantum dot light-emitting layer and the metal oxide electron transport layer. Since the electron transport ability of the transition layer is more than one order of magnitude lower than that of the metal oxide electron transport material, the transition layer can play a role in suppressing electron transport, thereby facilitating regulating a balance of injection and transportation of charge carriers in the R sub pixel and the G sub pixel, improving performance of the R sub pixel and the G sub pixel. At the same time, the transition layer can isolate the metal oxide electron transport layer from the quantum dot light-emitting layer, thereby effectively suppressing a defect state luminescence of the metal oxide.

In the B1 sub pixel of the present embodiment, a transition layer with a certain electron transport ability is added between the organic material light-emitting layer and the metal oxide electron transport layer. The transition layer can play a role in electron transport, and since the electron transport layer in the B1 sub pixel adopts the metal oxide, the electron transport ability of the electron transport layer is much higher than that of the transition layer, thereby ensuring electron transport.

Therefore, by adding a transition layer in the R sub pixel and the G sub pixel based on quantum dot and the B1 sub pixel based on organic light-emitting material, and using a metal oxide as the electron transport layer in the B1 sub pixel, structures and technologies of the R sub pixel, the G sub pixel, and the B1 sub pixel are ultimately ensured to be the same, effectively solving the problem of incompatibility between the structure and the technology during existing process of preparing QLED and OLED.

In one embodiment, a thickness of the first transition layer is 2-20 nm;

And/or, a thickness of the second transition layer is 2-20 nm;

And/or, a thickness of the third transition layer is 2-20 nm;

And/or, a thickness of the fourth transition layer is 2-20 nm.

Within the thickness range, a balance of charge carriers of the R sub pixel and the G sub pixel can be further controlled to achieve higher luminous efficiency.

In one embodiment, a thickness of the first electron transport layer is 20-50 nm;

And/or, a thickness of the second electron transport layer is 20-50 nm;

And/or, a thickness of the third electron transport layer is 20-50 nm;

And/or, a thickness of the fourth electron transport layer is 20-50 nm.

Figure 2:
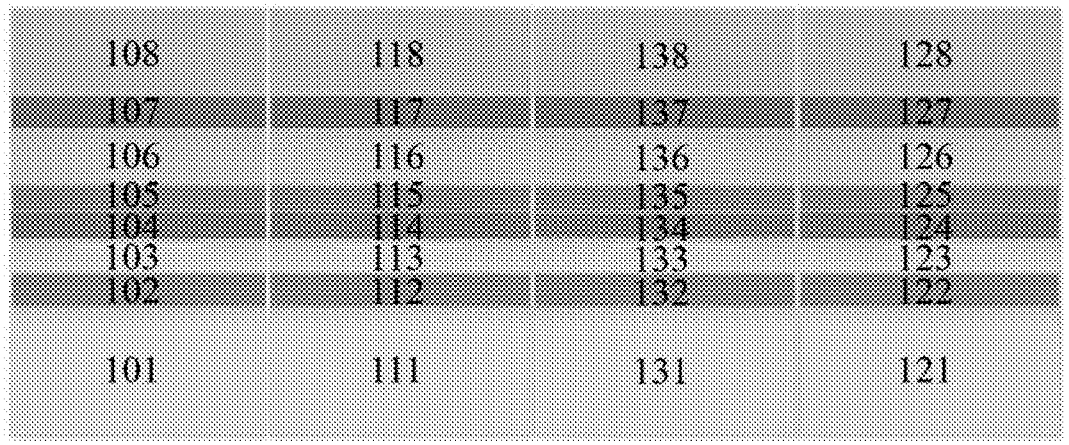
FIG. 2 is a schematic diagram of another structure of a display device provided in one embodiment of the present disclosure.

In one embodiment, as shown in FIG. 2, each pixel further includes a second blue light sub pixel, the blue light sub pixel includes a fourth anode (such as ITO/Ag/ITO) 131, a fourth hole injection layer (HIL) 132, a fourth hole transport layer (HTL) 123, a blue light quantum dot emitting layer (EML-B, QD) 134, a fourth transition layer (BL) 135, a fourth electron transport layer (ETL) 136, a fourth cathode 137, and a fourth capping layer (CPL, such as NPB) 138 arranged in layers in sequence;

Among them, the fourth anode in the second blue light sub pixel and the third anode in the first blue light sub pixel are located on one same side.

In the present embodiment, the first anode, the second anode, the third anode, and the fourth anode are all total reflection electrodes, and the first cathode, the second cathode, the third cathode, and the fourth cathode are all transmission electrodes. A light emitted by the display device is emitted from the first cathode, the second cathode, the third cathode, and the fourth cathode. A first capping layer, a second capping layer, a third capping layer and a fourth capping layer are respectively arranged on the first cathode, the second cathode, the third cathode, and the fourth cathode, which can increase capping efficiency, thereby improving luminous efficiency of the device. And certainly the first anode, the second anode, the third anode, and the fourth anode may be transmission electrodes. The first cathode, the second cathode, the third cathode, and the fourth cathode may be total reflection electrodes. A light emitted by the display device is emitted from the first anode, the second anode, the third anode, and the fourth anode. The first capping layer, the second capping layer, the third capping layer and the fourth capping layer are respectively arranged on the first anode, second anode, third anode, and fourth anode, which can increase capping efficiency, thereby improving the luminous efficiency of the device.

In one embodiment, materials of the first capping layer, the second capping layer, the third capping layer, and the fourth capping layer may all be the same as a material of the hole transport layer, such as CBP etc.; and may also be the same as a material of the electron transport layer, such as LiF etc.; and may also be phenanthroline and derivatives of the phenanthroline.

In one embodiment, a thickness of the first capping layer is 30 nm-150 nm;

And/or, a thickness of the second capping layer is 30 nm-150 nm;

And/or, a thickness of the third capping layer is 30 nm-150 nm;

And/or, a thickness of the fourth capping layer is 30 nm-150 nm.

In one embodiment, an emission wavelength of the red light quantum dot is 610-625 nm, and/or an emission wavelength of the green light quantum dot is 525-550 nm, and/or an emission wavelength of the blue light quantum dot is 450-480 nm.

In one embodiment, thicknesses of the red light quantum dot emitting layer, the green light quantum dot emitting layer, the first blue light quantum dot emitting layer, and the second blue light quantum dot emitting layer are all 5 nm-100 nm.

In one embodiment, the red light quantum dot, the green light quantum dot, and the blue light quantum dot may be independently selected from one or more of a binary phase quantum dot, a ternary phase quantum dot, a tetrad phase quantum dot, etc. Among them, the binary phase quantum dot includes one or more of CdS, CdSe, CdTe, InP, AgS, PbS, PbSe, HgS, etc.; the ternary phase quantum dot includes one or more of ZnCdS, CuInS, ZnCdSe, ZnSeS, ZnCdTe, PbSeS, etc.; the tetrad phase quantum dot includes one or more of ZnCdS/ZnSe, CuInS/ZnS, ZnCdSe/ZnS, CuInSeS, ZnCdTe/ZnS, PbSeS/ZnS, etc. The quantum dot may be cadmium-containing or cadmium free. The quantum dot light-emitting layer of this material has characteristics of wide excitation spectrum and continuous distribution, as well as high emission spectrum stability.

In one embodiment, the blue light organic emitting material may be selected from one or more of polyfluorene and derivatives of the polyfluorene.

In one embodiment, the first anode, the second anode, the third anode, and the fourth anode are all total reflection electrodes, and a material of the total reflection electrode may be selected from one of a metal such as Al, Ag, Mo, etc. and an alloy of the metal material, but not limited to them. It should be noted that in the embodiments of the present disclosure, an ITO electrode (a transparent electrode) such as ITO/Ag/ITO can also be arranged on two sides of the total reflection electrode to reduce a work function of electrode and facilitate charge injection. In one embodiment, a thickness of the total reflection electrode is greater than or equal to 80 nm, such as 80 nm-120 nm. In one embodiment, a thickness of the ITO electrode is 10 nm-20 nm.

In one embodiment, materials of the first hole injection layer, the second hole injection layer, the third hole injection layer, and the fourth hole injection layer may all be selected from, but are not limited to, one or two or more of a poly (3, 4-ethylenedioxythiophene)-poly (styrene sulfonic acid) (PEDOT: PSS), a CuPc, a P3HT, a transition metal oxide, and a transition metal chalcogenide. Among them, the transition metal oxide includes one or two or more of NiON, MOON, WON, CrON and CuO; the metal chalcogenide includes one or two or more of MoSN, MoSeN, WSN, WSeN, and CuS.

In one embodiment, a thickness of the first hole injection layer is about 10 nm-40 nm;

And/or, a thickness of the second hole injection layer is about 10 nm-40 nm;

And/or, a thickness of the third hole injection layer is about 10 nm-40 nm;

And/or, a thickness of the fourth hole injection layer is about 10 nm-40 nm.

In one embodiment, materials of the first hole transport layer, the second hole transport layer, the third hole transport layer and the fourth hole transport layer may all be selected from a material with good hole transport performance, for example, the material may include, but are not limited to, one or more of poly (9, 9-dioctylfluorene-CO—N-(4-butylphenyl)diphenylamine) (TFB), polyvinyl carbazole (PVK), poly (N, N' bis(4-butylphenyl)-N, N'-bis(phenyl) benzidine) (Poly-TPD), 4, 4', 4"-tris (carbazole-9-yl)triphenylamine (TCTA), 4, 4'-bis(9-carbazolyl) biphenyl (CBP), NPB, NiO, $MoO_3$, etc.

In one embodiment, a thickness of the first hole transport layer is about 10 nm-40 nm;

And/or, a thickness of the second hole transport layer is about 10 nm-40 nm;

And/or, a thickness of the third hole transport layer is about 10 nm-40 nm;

And/or, a thickness of the fourth hole transport layer is about 10 nm-40 nm.

In one embodiment, materials of the first electron transport layer, the second electron transport layer, the third electron transport layer, and the fourth electron transport layer may all adopt a conventional electron transport material in the prior art, which includes but not limited to one of or a mixture combined any of ZnO, MZO (magnesium zinc oxide), AMO (aluminum zinc oxide), MLZO (magnesium lithium zinc oxide), $TiO_2$, CsF, LiF, $CsCO_3$, and Alq3.

In one embodiment, a thickness of the first electron transport layer is 20-50 nm;

And/or, a thickness of the second electron transport layer is 20-50 nm;

And/or, a thickness of the third electron transport layer is 20-50 nm;

And/or, a thickness of the fourth electron transport layer is 20-50 nm.

In one embodiment, the first cathode, the second cathode, the third cathode and the fourth cathode may be selected from one of aluminum (Al) electrode, silver (Ag) electrode and gold (Au) electrode; and may also be selected from one of aluminum nanowire, silver nanowire and gold nanowire. The above materials have a smaller resistance, allowing for smooth injection of charge carriers.

In one embodiment, a thickness of the first cathode is about 5 nm-40 nm;

And/or, a thickness of the second cathode is about 5 nm-40 nm;

And/or, a thickness of the third cathode is about 5 nm-40 nm;

And/or, a thickness of the fourth cathode is about 5 nm-40 nm.

Figure 3:
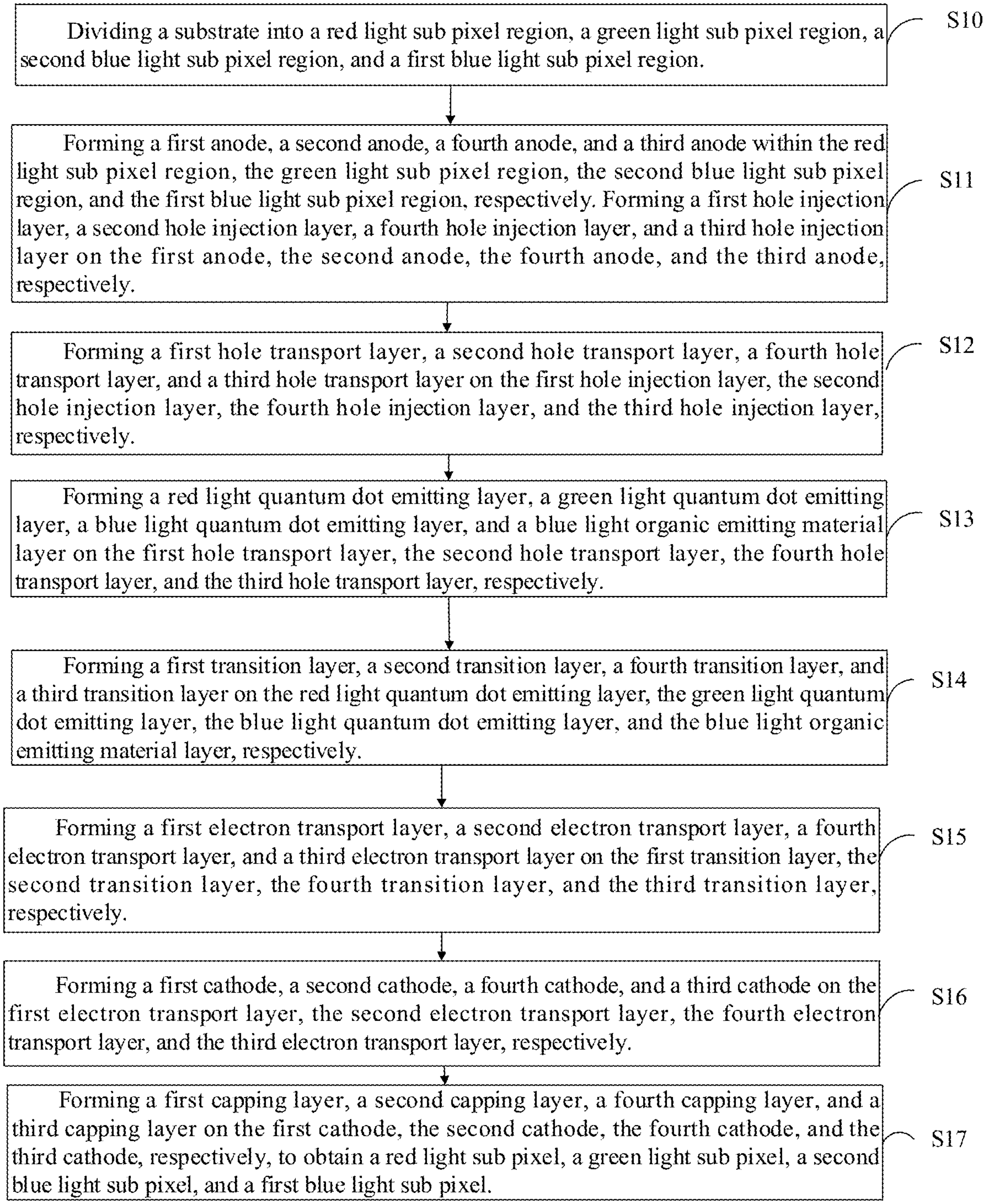
FIG. 3 is a flowchart of a preparation method for a display device provided in one embodiment of the present disclosure.

Taking the structure shown in FIG. 2 as an example, a preparation method for the display device is introduced. The embodiments of the present disclosure provide a preparation method for the display device, the display device includes a plurality of pixels arranged in an array, each pixel includes a red light sub pixel, a green light sub pixel, and a first blue light sub pixel arranged in an array. As shown in FIG. 3, a preparation method for each pixel includes following steps:

S10: Dividing a substrate 200 into a red light sub pixel region, a green light sub pixel region, a second blue light sub pixel region, and a first blue light sub pixel region.

Figure 4:
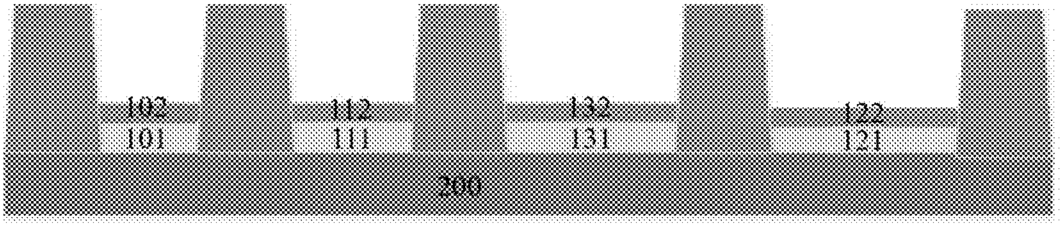
FIG. 4 is a schematic diagram of a structure obtained through step S11 in FIG. 3.

S11: Forming a first anode 101, a second anode 111, a fourth anode 131, and a third anode 121 within the red light sub pixel region, the green light sub pixel region, the second blue light sub pixel region, and the first blue light sub pixel region, respectively. Forming a first hole injection layer 102, a second hole injection layer 112, a fourth hole injection layer 132, and a third hole injection layer (HIL) 122 on the first anode, the second anode, the fourth anode, and the third anode, respectively, as shown in FIG. 4.

Figure 5:
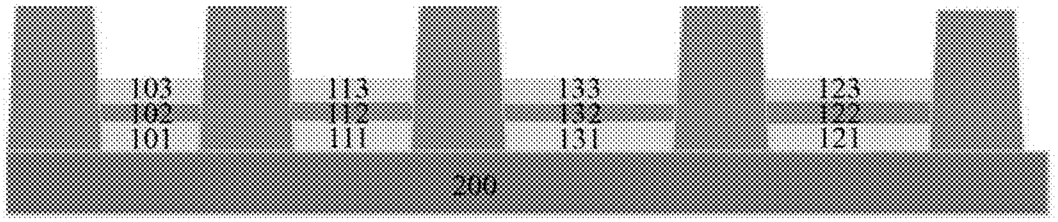
FIG. 5 is a schematic diagram of a structure obtained through step S12 in FIG. 3.
Figure 6:
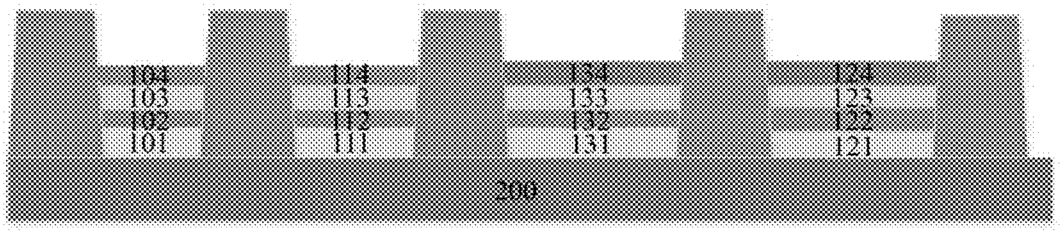
FIG. 6 is a schematic diagram of a structure obtained through step S13 in FIG. 3.
Figure 7:
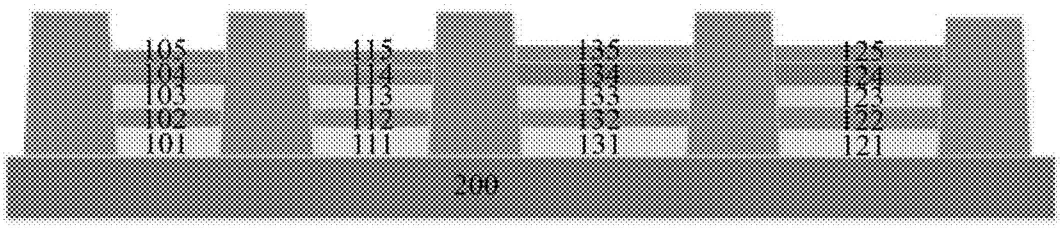
FIG. 7 is a schematic diagram of a structure obtained through step S14 in FIG. 3.
Figure 8:
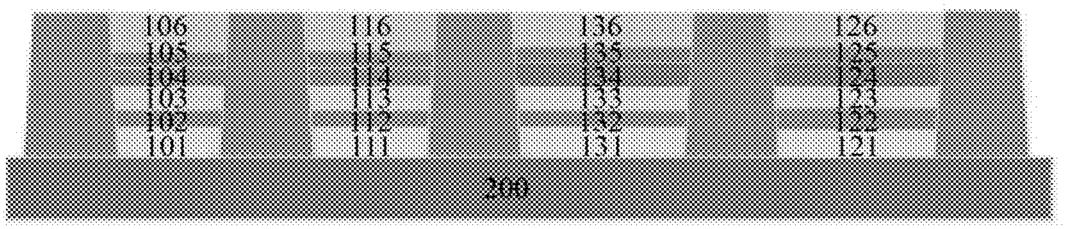
FIG. 8 is a schematic diagram of a structure obtained through step S15 in FIG. 3.
Figure 9:
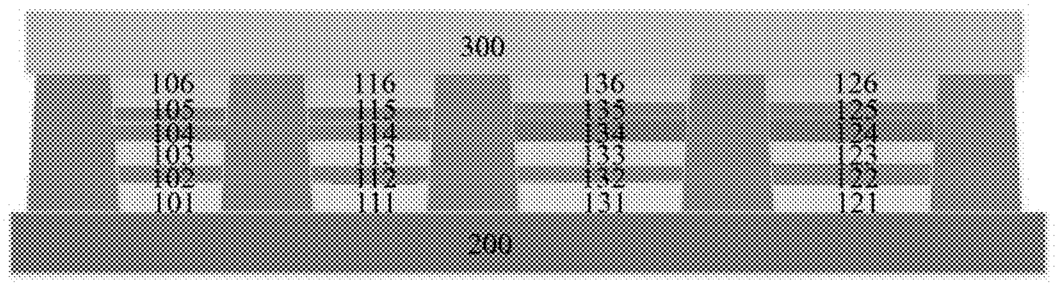
FIG. 9 is a schematic diagram of a structure obtained through step S16 in FIG. 3.
Figure 10:
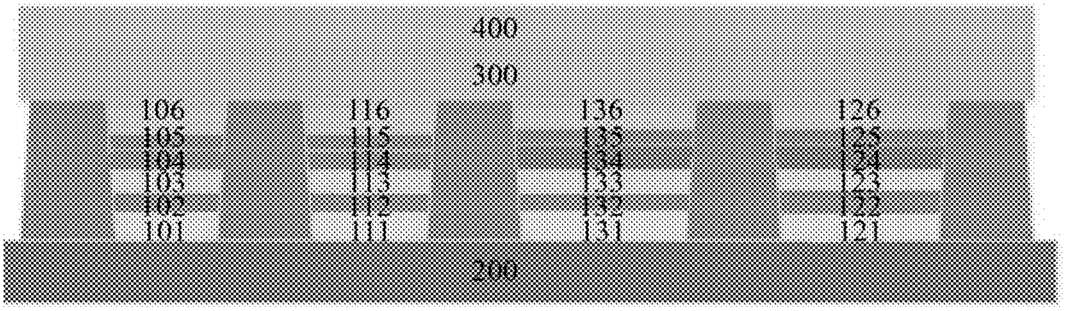
FIG. 10 is a schematic diagram of a structure obtained through step S17 in FIG. 3.

S12: Forming a first hole transport layer 102, a second hole transport layer 113, a fourth hole transport layer 133, and a third hole transport layer (HTL) 123 on the first hole injection layer, the second hole injection layer, the fourth hole injection layer, and the third hole injection layer (HTL), respectively, as shown in FIG. 5;

S13: Forming a red light quantum dot emitting layer (EML-R, QD) 104, a green light quantum dot emitting layer (EML-G, QD) 114, a blue light quantum dot emitting layer (EML-B, QD) 134, and a blue light organic emitting material layer (EML-B, OLED) 124 on the first hole transport layer, the second hole transport layer, the fourth hole transport layer, and the third hole transport layer, respectively, as shown in FIG. 6;

S14: Forming a first transition layer 105, a second transition layer 115, a fourth transition layer 135, and a third transition layer (BL) 125 on the red light quantum dot emitting layer, the green light quantum dot emitting layer, the blue light quantum dot emitting layer, and the blue light organic emitting material layer, respectively, as shown in FIG. 7;

S15: Forming a first electron transport layer 106, a second electron transport layer 116, a fourth electron transport layer 136, and a third electron transport layer (ETL) 126 on the first transition layer, the second transition layer, the fourth transition layer, and the third transition layer, respectively, as shown in FIG. 8;

S16: Forming a first cathode 300, a second cathode 300, a fourth cathode 300, and a third cathode 300 on the first electron transport layer, the second electron transport layer, the fourth electron transport layer, and the third electron transport layer, respectively, as shown in FIG. 9;

S17: Forming a first capping layer 400, a second capping layer 400, a fourth capping layer 400, and a third capping layer (CPL) 400 on the first cathode, the second cathode, the fourth cathode, and the third cathode, respectively, to obtain a red light sub pixel, a green light sub pixel, a second blue light sub pixel, and a first blue light sub pixel, as shown in FIG. 10;

Among them, materials of the first transition layer, the second transition layer, the third transition layer, and the fourth transition layer all include an aromatic compound with a conjugate plane. Materials of the first electron transport layer, the second electron transport layer, the third electron transport layer, and the fourth electron transport layer all include a metal oxide.

It should be noted that, the substrate is divided into the red light sub pixel region, the green light sub pixel region, the second blue light sub pixel region, and the first blue light sub pixel region through a method for preparing a dam-shaped pixel-defining layer on the substrate. A material of a pixel-defining layer and a preparation method therefor are the prior art and are not be further described here. After removing the pixel-defining layer in the display device shown in FIG. 10, the corresponding display device shown in FIG. 2 is obtained.

In the present embodiment, both the R sub pixel and the G sub pixel are light-emitting diodes based on quantum dot luminous material (QLEDs), while the B1 sub pixel is light-emitting diodes based on organic luminous material (OLED), so that the R sub pixel and the G sub pixel can achieve high luminous efficiency and long lifetime, while the B1 sub pixel can also achieve high luminous efficiency and long lifetime. By combining red light and green light QLED and blue light OLED, the luminous efficiency and lifetime of the full-color display device are improved as a whole.

In the present embodiment, materials of the first transition layer, the second transition layer, and the third transition layer are all a aromatic compound with a conjugated plane. The material has a certain electron transport ability, which is more than one order of magnitude lower than the electron transport ability of a metal oxide electron transport material commonly used in quantum dot light-emitting diodes. In one embodiment, the aromatic compound with the conjugate plane may be selected from one or more of 8-hydroxyquinoline aluminum (AlQ), 1, 2, 4-triazole derivatives, PBD, TPBI, BPQ, NCB, Beq2 and DPVBi etc.

In existing R sub pixel and G sub pixel based on quantum dot material, an injection and transportation efficiency of electrons is usually much higher than that of holes, resulting in an imbalance between the injection of electrons and the injection of the holes, and limiting an improvement of device efficiency. In the R sub pixel and G sub pixel of the present embodiment, a transition layer with a certain electron transport ability is added between a quantum dot light-emitting layer and a metal oxide electron transport layer. Since the electron transport ability of the transition layer is more than one order of magnitude lower than that of the metal oxide electron transport material, the transition layer can play a role in suppressing electron transport, thereby facilitating regulating a balance of injection and transportation of charge carriers in the R sub pixel and the G sub pixel, improving performance of the R sub pixel and the G sub pixel. At the same time, the transition layer can isolate the metal oxide electron transport layer from the quantum dot light-emitting layer, thereby effectively suppressing a defect state luminescence of the metal oxide.

In the B1 sub pixel of the present embodiment, a transition layer with a certain electron transport ability is added between the organic material light-emitting layer and the metal oxide electron transport layer. The transition layer can play a role in electron transport, and since the electron transport layer in the B1 sub pixel adopts the metal oxide, the electron transport ability of the electron transport layer is much higher than that of the transition layer, thereby ensuring electron transport.

Therefore, by adding a transition layer in the R sub pixel and the G sub pixel based on quantum dot and the B1 sub pixel based on an organic light-emitting material, and using a metal oxide as an electron transport layer in the B1 sub pixel, structures and technologies of the R sub pixel, the G sub pixel, and the B1 sub pixel are ultimately ensured to be the same, effectively solving the problem of incompatibility between the structure and the technology during existing process of preparing QLED and OLED.

For more details of the display device, please refer to the description above and not describe in detail here.

In the embodiments of the present disclosure, the preparation method for each layer mentioned above may be a chemical method or a physical method, wherein the chemical method includes, but not limited to, one or more of a chemical vapor deposition, a successive ionic layer adsorption and reaction, an anodization, an electrolytic deposition, and a coprecipitation method; the physical method includes, but not limited to, one or more of a solution method (such as a spin coating, a printing, a scraping, a dipping, an immersion, a spraying, a roller coating, a casting, a slot coating or a strip-shaped coating method, etc.), an evaporation method (such as a thermal evaporation, an electron beam evaporation, a magnetron sputtering or multi-arc ion plating method, etc.), and a deposition method (such as a physical vapor deposition, an element-layer deposition, a pulsed laser deposition method, etc.).

It should be understood that the application of the present disclosure is not limited to the above-mentioned embodiments, and those skilled in the art can make transformations or modifications based on the above-mentioned descriptions, and all these transformations and modifications should belong to the protection of the appended claims of the present disclosure.

What is claimed is:

1. A display device, comprising a plurality of pixels arranged in array, wherein each pixel comprises a red light sub pixel, a green light sub pixel, and a first blue light sub pixel arranged in array;

the red light sub pixel comprises a first anode, a first hole functional layer, a red light quantum dot emitting layer, a first transition layer, a first electron transport layer, and a first cathode arranged sequentially in layers;

the green light sub pixel comprises a second anode, a second hole functional layer, a green light quantum dot emitting layer, a second transition layer, a second electron transport layer, and a second cathode arranged sequentially in layers;

the first blue light sub pixel comprises a third anode, a third hole functional layer, a blue light organic emitting material layer, a third transition layer, a third electron transport layer, and a third cathode arranged sequentially in layers;

the first anode of the red light sub pixel, the second anode of the green light sub pixel, and the third anode of the first blue light sub pixel are located on one same side of the display device;

a material of the first transition layer, a material of the second transition layer, and a material of the third transition layer all comprise an aromatic compound with a conjugate plane wherein the aromatic compound with the conjugate plane is selected from one or more of 8-hydroxyquinoline aluminum, 1,2,4-triazole derivative, phenyl biphenylyl oxadiazole, 8-hydroxyquinoline beryllium and 4,4'-bis(2,2-diphenylvinyl)-1,1'-biphenyl, and a material of the first electron transport layer, a material of the second electron transport layer, and a material of the third electron transport layer all comprise a metal oxide.

2. The display device according to claim 1, wherein the each pixel further comprises a second blue light sub pixel, the second blue light sub pixel comprises a fourth anode, a fourth hole functional layer, a blue light quantum dot emitting layer, a fourth transition layer, a fourth electron transport layer, and a fourth cathode arranged sequentially in layers;

the fourth anode in the second blue light sub pixel and the third anode in the first blue light sub pixel are located on one same side;

a material of the fourth transition layer comprises an aromatic compound with a conjugate plane; a material of the fourth electron transport layer comprises a metal oxide.

3. The display device according to claim 1, wherein a thickness of the first transition layer is 2-20 nm.

4. The display device according to claim 1, wherein a thickness of the second transition layer is 2-20 nm.

5. The display device according to claim 1, wherein a thickness of the third transition layer is 2-20 nm.

6. The display device according to claim 1, wherein a thickness of the first electron transport layer is 20-50 nm.

7. The display device according to claim 1, wherein a thickness of the second electron transport layer is 20-50 nm.

8. The display device according to claim 1, wherein a thickness of the third electron transport layer is 20-50 nm.

9. The display device according to claim 1, wherein an emission wavelength of the red light quantum dot is 610-625 nm, and/or an emission wavelength of the green light quantum dot is 525-550 nm, and/or the blue light organic emitting material is selected from one or more of a polyfluorene and a derivative of the polyfluorene.

10. The display device according to claim 9, wherein the red light quantum dot, the green light quantum dot, and the blue light quantum dot are independently selected from one or more of a binary phase quantum dot, a ternary phase quantum dot, and a tetrad phase quantum dot.

11. The display device according to claim 10, wherein the binary phase quantum dot comprises one or more of CdS, CdSe, CdTe, InP, AgS, PbS, PbSe and HgS.

12. The display device according to claim 10, wherein the ternary phase quantum dot comprises one or more of ZnCdS, CuInS, ZnCdSe, ZnSeS, ZnCdTe and PbSeS.

13. The display device according to claim 10, wherein the tetrad phase quantum dot comprises one or more of ZnCdS/ZnSe, CuInS/ZnS, ZnCdSe/ZnS, CuInSeS, ZnCdTe/ZnS and PbSeS/ZnS.

14. The display device according to claim 1, wherein the red light sub pixel further comprises a first capping layer, the first capping layer is located on a surface of one side of the first cathode away from the first anode;

the green light sub pixel further comprises a second capping layer, the second capping layer is located on a surface of one side of the second cathode away from the second anode;

the first blue light sub pixel further comprises a third capping layer, the third capping layer is located on a surface of one side of the third cathode away from the third anode.

15. The display device according to claim 1, wherein a thickness of the red light quantum dot emitting layer is 5-100 nm.

16. The display device according to claim 1, wherein a thickness of the green light quantum dot emitting layer is 5-100 nm.

17. A preparation method for a display device comprising a plurality of pixels arranged in array, wherein each pixel comprises a red light sub pixel, a green light sub pixel, and a first blue light sub pixel arranged in array;

a preparation method for the each pixel comprises steps:

dividing a substrate into a red light sub pixel region, a green light sub pixel region, and a first blue light sub pixel region;

forming a first anode, a second anode, and a third anode within the red light sub pixel region, the green light sub pixel region, and the first blue light sub pixel region, respectively; and forming a first hole functional layer, a second hole functional layer, and a third hole functional layer on the first anode, the second anode, and the third anode, respectively;

forming a red light quantum dot emitting layer, a green light quantum dot emitting layer, and a blue light organic emitting material layer on the first hole functional layer, the second hole functional layer, and the third hole functional layer, respectively;

forming a first transition layer, a second transition layer, and a third transition layer on the red light quantum dot emitting layer, the green light quantum dot emitting layer, and the blue light organic emitting material layer, respectively; and forming a first electron transport layer, a second electron transport layer, and a third electron transport layer on the first transition layer, the second transition layer, and the third transition layer, respectively;

forming a first cathode, a second cathode, and a third cathode on the first electron transport layer, the second electron transport layer, and the third electron transport layer, respectively, to obtain the red light sub pixel, the green light sub pixel, and the first blue light sub pixel, respectively;

wherein a material of the first transition layer, a material of the second transition layer, and a material of the third transition layer all comprise an aromatic compound with a conjugate plane wherein the aromatic compound with the conjugate plane is selected from one or more of 8-hydroxyquinoline aluminum, 1,2,4-triazole derivative, phenyl biphenylyl oxadiazole, 8-hydroxyquinoline beryllium and 4,4'-bis(2,2-diphenylvinyl)-1,1'-biphenyl; a material of the first electron transport layer, a material of the second electron transport layer, and a material of the third electron transport layer all comprise a metal oxide.

18. A preparation method for a display device comprising a plurality of pixels arranged in array, wherein each pixel comprises a red light sub pixel, a green light sub pixel, and a first blue light sub pixel arranged in array;

a preparation method for the each pixel comprises steps:

dividing a substrate into a red light sub pixel region, a green light sub pixel region, and a first blue light sub pixel region;

forming a first cathode, a second cathode, and a third cathode within the red light sub pixel region, the green light sub pixel region, and the first blue light sub pixel region, respectively;

forming a first electron transport layer, a second electron transport layer, and a third electron transport layer on the first anode, the second anode, and the third anode, respectively; and forming a first transition layer, a second transition layer, and a third transition layer on the first electron transport layer, the second electron transport layer, and the third electron transport layer;

forming a red light quantum dot emitting layer, a green light quantum dot emitting layer, and a blue light organic emitting material layer on the first transition layer, the second transition layer, and the third transition layer, respectively;

forming a first hole functional layer, a second hole functional layer, and a third hole functional layer on the red light quantum dot emitting layer, the green light quantum dot emitting layer, and the blue light organic emitting material layer, respectively;

forming a first anode, a second anode, and a third anode on the first hole functional layer, the second hole functional layer, and the third hole functional layer, respectively, to obtain the red light sub pixel, the green light sub pixel, the first blue light sub pixel, respectively;

wherein a material of the first transition layer, a material of the second transition layer, and a material of the third transition layer all comprise an aromatic compound with a conjugate plane wherein the aromatic compound with the conjugate plane is selected from one or more of 8-hydroxyquinoline aluminum, 1,2,4-triazole derivative, phenyl biphenylyl oxadiazole, 8-hydroxyquinoline beryllium and 4,4'-bis(2,2-diphenylvinyl)-1,1'-biphenyl; a material of the first electron transport layer, a material of the second electron transport layer, and a material of the third electron transport layer all comprise a metal oxide.

* * * * *